United States Patent
Simmons et al.

(10) Patent No.: US 6,297,676 B1
(45) Date of Patent: Oct. 2, 2001

(54) HIGH CAPACITANCE DRIVE FAST SLEWING AMPLIFIER

(75) Inventors: John W. Simmons, Tamarac; John J. Parkes, Boynton Beach; Manbir Nag, Coral Springs, all of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/692,985

(22) Filed: Oct. 23, 2000

(51) Int. Cl.[7] .................................................. H03B 1/00
(52) U.S. Cl. ...................... 327/111; 327/170; 327/183; 327/561
(58) Field of Search .................... 327/108, 111, 327/112, 170, 178, 179, 180, 560–563, 365, 182, 183, 309, 315, 316, 318, 319, 320, 321, 323, 324, 325; 361/512, 513, 515; 330/254, 260, 261, 278, 279

(56) References Cited

U.S. PATENT DOCUMENTS

| | | |
|---|---|---|
| 4,167,711 | 9/1979 | Smoot .................................. 331/17 |
| 5,343,084 * | 8/1994 | Gens ................................... 327/111 |
| 5,744,878 * | 4/1998 | Wachter et al. ..................... 327/111 |

* cited by examiner

Primary Examiner—Timothy P. Callahan
Assistant Examiner—An T. Luu
(74) Attorney, Agent, or Firm—Randi L. Dulaney

(57) ABSTRACT

A ring inhibiting charging and discharging circuit (100) for use with an amplification circuit (102) that drives a load (108) is responsive to an input (104) and is capable of generating an output (106) corresponding to the input (104). The ring inhibiting charging and discharging circuit (100) includes a charge element (120) that is responsive to the output (112) from the amplification circuit (102). The charge element (120) is capable of charging the load when the input voltage is greater than a preselected multiple of the output voltage. A discharge circuit (130) is responsive to the output (106) from the amplification circuit (102) and includes a feedback circuit (132) and a staging circuit (134). The feedback circuit (132) asserts a difference signal when the output voltage is less than the preselected multiple of the input voltage. The staging circuit (134) is responsive to difference signal and gradually reduces the rate at which the load (108) is discharged over a preselected period of time once the difference signal indicates that the output voltage is within a preselected range of the input voltage.

19 Claims, 4 Drawing Sheets

HIGH CAPACITANCE DRIVE FAST SLEWING AMPLIFIER

BACKGROUND OF THE INVENTION

1. Field of the Invention

The present invention relates to signal processing and, more specifically, to electronic amplifiers.

2. Description of the Prior Art

Amplification circuits, such as those used with wireless communications equipment, are frequently called on to charge and discharge large capacitive loads. If a fast slew rate is required of the amplification circuit, then the output stage typically experiences a significant voltage drop. Such amplification circuits also typically draw a significant bias current relative to slewing current, giving rise to a low bias efficiency. Furthermore, some amplification circuits give rise to transmission line effects, such as ringing, when driving large capacitive loads.

Therefore, there is a need for a nearly rail-to-rail amplification circuit with a high bias efficiency.

DETAILED DESCRIPTION OF THE INVENTION

Figure 1:
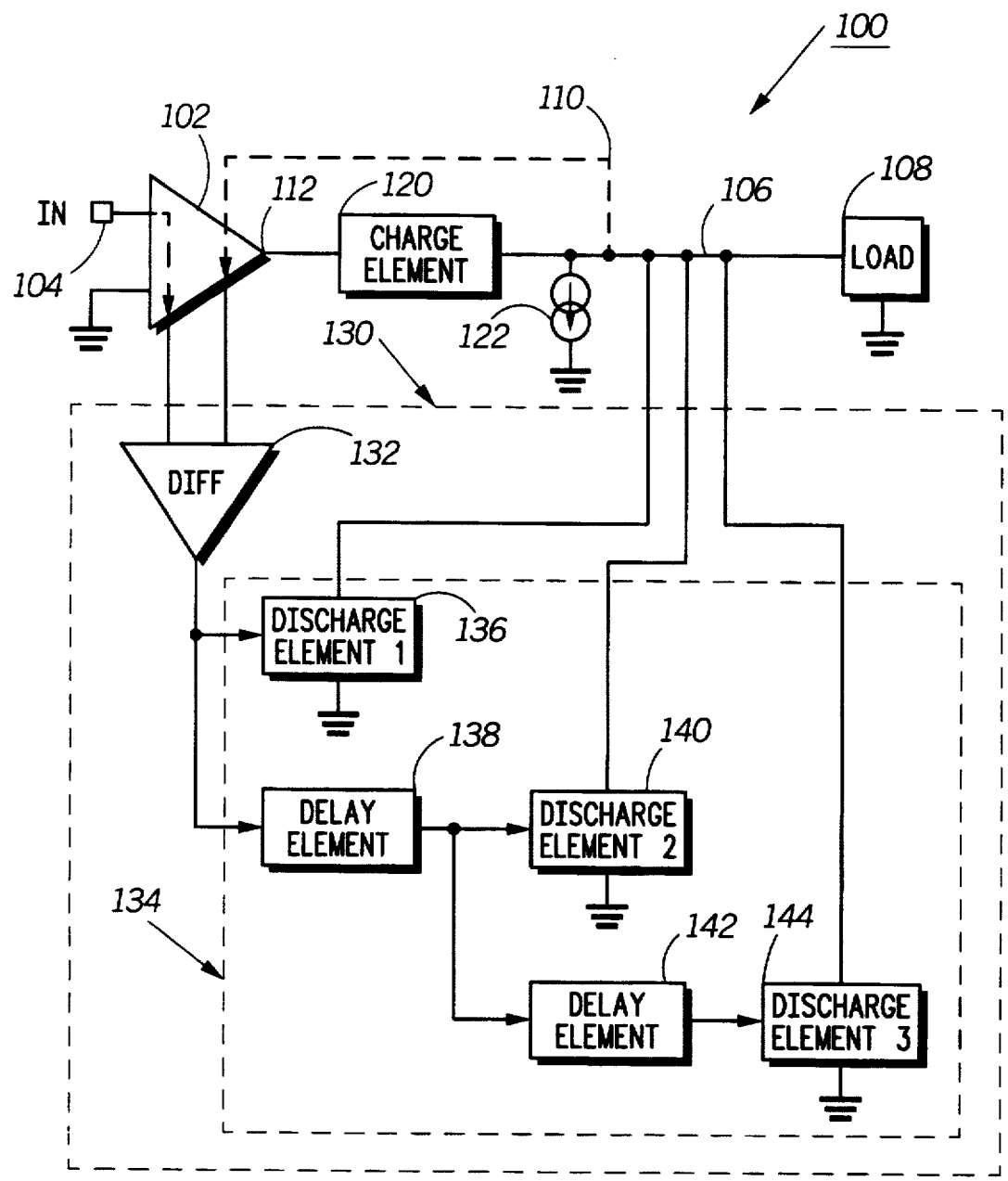
FIG. 1 is a block diagram of one embodiment of the invention.

A preferred embodiment of the invention is now described in detail. Referring to the drawings, like numbers indicate like parts throughout the views.

As shown in FIG. 1, one embodiment of the invention is a ring inhibiting charging and discharging circuit 100 for use with an amplification circuit 102 that drives a capacitive load 108. The amplification circuit 102 is responsive to an input 104 and is capable of generating an output 106 corresponding to the input 104. The ring inhibiting charging and discharging circuit 100 includes a charge element 120 that is responsive to the output 112 from the amplification circuit 102. A current source 122 may be employed to maintain proper electrical characteristics of the amplification circuit 102. The charge element 120 charges the load 108 when the input voltage is greater than the output voltage (or a preselected multiple thereof). A discharge circuit 130 is responsive to the output 106 from the amplification circuit 102 and includes a feedback circuit and a staging circuit 134. The feedback circuit includes a difference amplifier 132 that is responsive to a feedback 110 from the output 106 and that asserts a difference signal when the output voltage is less than the preselected multiple of the input voltage. The staging circuit 134 is responsive to difference signal and causes the load 108 to be discharged gradually over a preselected period of time when the difference signal is asserted.

The staging circuit 134 includes a first discharge element 136, a first delay element 138 and at least one second discharge element 140. Typically, the staging circuit 134 also includes a second delay element 142 and a third discharge element 144. The first discharge element 136 is responsive to the difference signal from the difference amplifier 132 and sinks charge from the load 108 when the difference signal is asserted. The first discharge element 136 substantially ceases to sink charge from the load 108 when the difference signal is de-asserted. The first delay element 138 generates a first delay signal that is asserted shortly after the difference signal is asserted. Once the difference signal is de-asserted, the first delay signal is de-asserted after a first predetermined amount of time. The second discharge element 140 sinks charge from the load 108 when the first delay signal is asserted and substantially ceases to sink charge from the load 180 when the first delay signal is de-asserted. The second delay element 142 is responsive to the first delay signal from the first delay element 138 and generates a first delay signal that is asserted shortly after the first delay signal is asserted. Once the first delay signal is de-asserted, the second delay signal is de-asserted after a second predetermined amount of time. The third discharge element 144 sinks charge from the load 108 when the second delay signal is asserted and substantially ceases to sink charge from the load 108 when the second delay signal is deasserted.

When the input 104 changes so that the load 108 must be discharged, the difference amplifier 132 detects the voltage at the input 104 going below the voltage at the output 106 (or a predetermined multiple thereof) and causes the first discharge element 136 to begin conducting, thereby discharging the load 108. Shortly thereafter, the second discharge element 140 and then the third discharge element 144 begin conducting, also discharging the load. Once the load 108 is sufficiently discharged relative to the input 104 the difference amplifier 132 causes the first discharge element to cease conducting. After a first delay induced by the first delay element 138, the second discharge element 140 ceases discharging the load 108, thereby decreasing the discharge rate of the load 108. After an additional delay induced by the second delay element 142, the third discharge element 144 ceases discharging the load 108, thereby substantially ending the discharge of the load 108. By staging the de-activation of the discharge elements 136, 140 and 144, the staging circuit 134 is able to gradually decrease the discharge capacity available to the load 108, thereby preventing overshoot of the discharge of the load 108.

Figure 2:
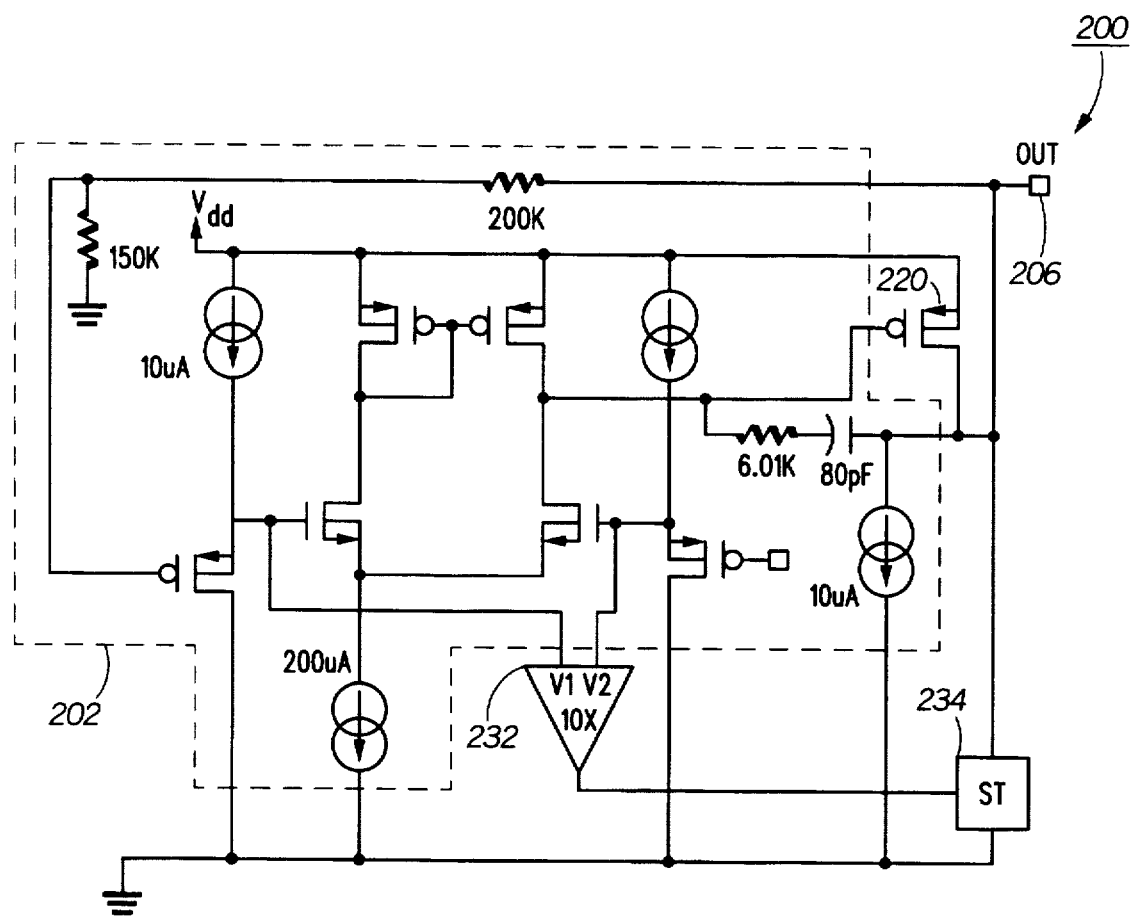
FIG. 2 is a schematic diagram of one embodiment of the invention.

As shown in FIG. 2, in one specific embodiment of an amplifier 200 according to the invention, the amplification circuit 202 is integrated with the charging and discharging elements in an integrated circuit. In the embodiment shown, the amplification circuit 202 is configured as a class A op-amp with a gain of 2.33 (1+200 k/150 k). This gain gives a rail-to-rail voltage at the output 206. In an application where the input comes from a device with a maximum output of 1.27 V (e.g., a digital to analog converter) the maximum output of the amplifier would be 2.33×1.27 V=2.951 V. In one exemplary application, the amplifier 200 would be required to charge and discharge a large capacitive load, e.g., a 0.02 μF load. In such an application, a class A op-amp would not have sufficient charging and discharging capability. Therefore, the charging element, comprising a transistor 220, and the discharging circuit, comprising the difference amplifier 232 and the staging circuit 234 are added to give the amplification circuit 202 a boost. The charging transistor 220 is biased to apply charge to the output 206 from a common voltage source $V_{dd}$ when the input 204 is of a value indicating that the amplification circuit 202 is to charge the load. The charging transistor 220 must be large enough to source the current necessary to charge the load with the required rise time. The difference amplifier 232 drives the staging circuit 234 to discharge the load when the input 204 goes low.

Figure 3:
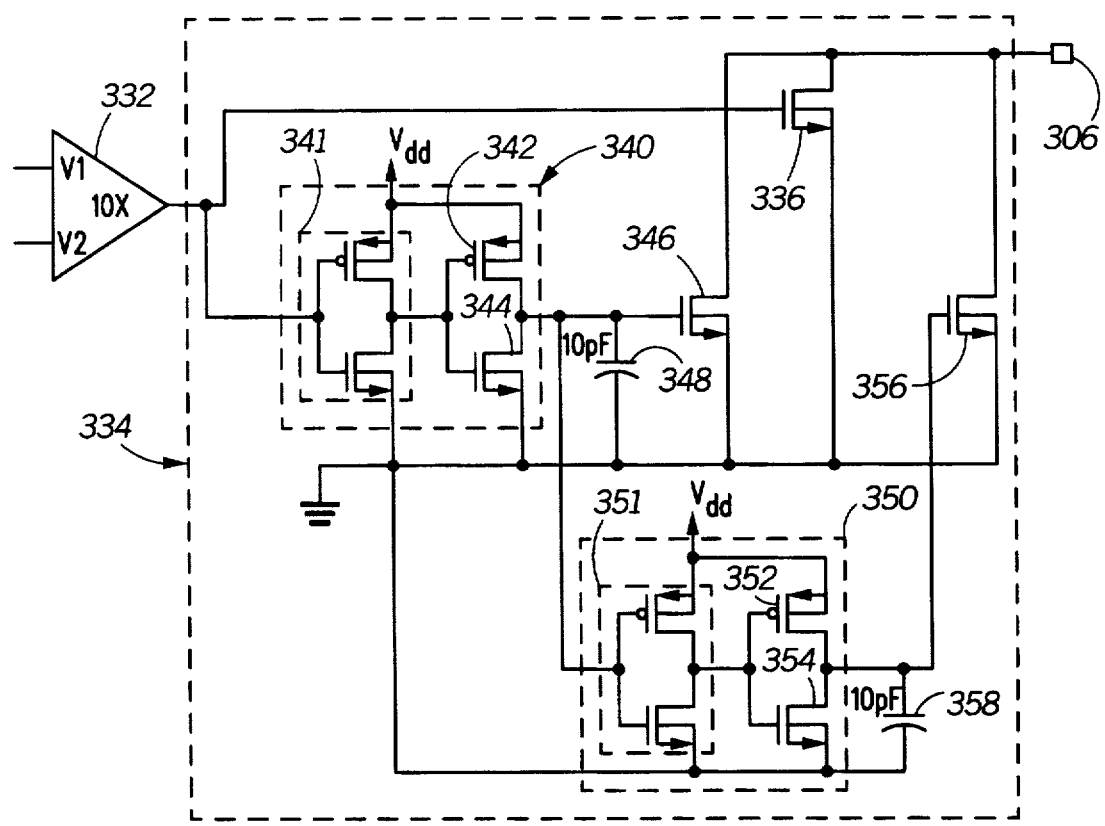
FIG. 3 is a schematic diagram of one embodiment of a discharge circuit according to FIG. 2.

As shown in more detail in FIG. 3, the staging circuit 334 includes a transistor 336 having two channel nodes, a first channel node coupled to the output (and, thus, the load), a second channel node coupled to ground and a gate electrically coupled to the output of the difference amplifier 332. This transistor 336 turns on almost immediately after the output of the difference amplifier goes high and begins discharging the load (which is electrically coupled to the output 306). A first pair of CMOS inverters 340 responds to the difference signal from the difference amplifier 332 and controls the turning "on" and "off" of the second discharge transistor 346. Similarly, a second pair of CMOS inverters 350 responds to the output from the first pair of inverters 340 and controls the turning "on" and "off" of the third discharge transistor 356.

Both of the transistors of the first inverter 341 of the first inverter pair 340 introduce a relatively short delay, thereby inverting the difference signal relatively quickly. The gate charging transistor 342 of the second inverter of the first inverter pair 340 also introduces a relatively short delay. Thus, when the difference signal goes high, indicating a discharge of the output 306, the second discharge transistor 346 is turned "on" relatively quickly. Similarly, both of the transistors of the first inverter 351 of the second inverter pair 350 introduce a relatively short delay, thereby inverting the difference signal relatively quickly. Also, the gate charging transistor 352 of the second inverter of the second inverter pair 350 also introduces a relatively short delay. Thus, when the output of the first inverter pair 340 goes high, the third discharge transistor 356 is turned "on" relatively quickly. Therefore, when the output of the difference amplifier 332 goes high (indicating that the load is to be discharged), discharge transistors 336, 346 and 356 are all turned "on" quickly, causing a rapid discharge of the load at the output 306.

While the charging transistors 342 and 352 of the first and second inverter pairs 340 and 350, respectively, have a relatively rapid response time, the gate discharge transistors 344 and 354 have a delayed response time and their output is further delayed by corresponding capacitors 348 and 358 placed at the gates of discharge transistors 346 and 356, respectively. Thus, when the output of the difference amplifier 332 goes low, the voltage at the gate of discharge transistor 336 goes low almost immediately, thereby causing discharge transistor 336 to substantially cease conducting almost immediately. However, the voltage at the gate of discharge transistor 346 goes low only after a first predetermined delay and, thus, discharge transistor 346 continues to sink current from the output 306 during the first predetermined delay. The voltage at the gate of discharge transistor 356 goes low after a second predetermined delay equal to the first predetermined delay plus the delay introduced by gate discharge transistor 354. Thus, discharge transistor 356 continues to sink current from the output 306 during the entire second predetermined delay. Therefore, while the staging circuit 334 causes all of the discharge transistors 336, 346 and 356 to begin discharging the output 306 almost immediately, they cause a gradual decrease of the discharge rate of the output 306 as the voltage at the output 306 approaches its nominally discharged value, thereby preventing a discharge overshoot. By gradually winding down the discharging of the load, the settling time of this circuit is kept low.

Figure 4:
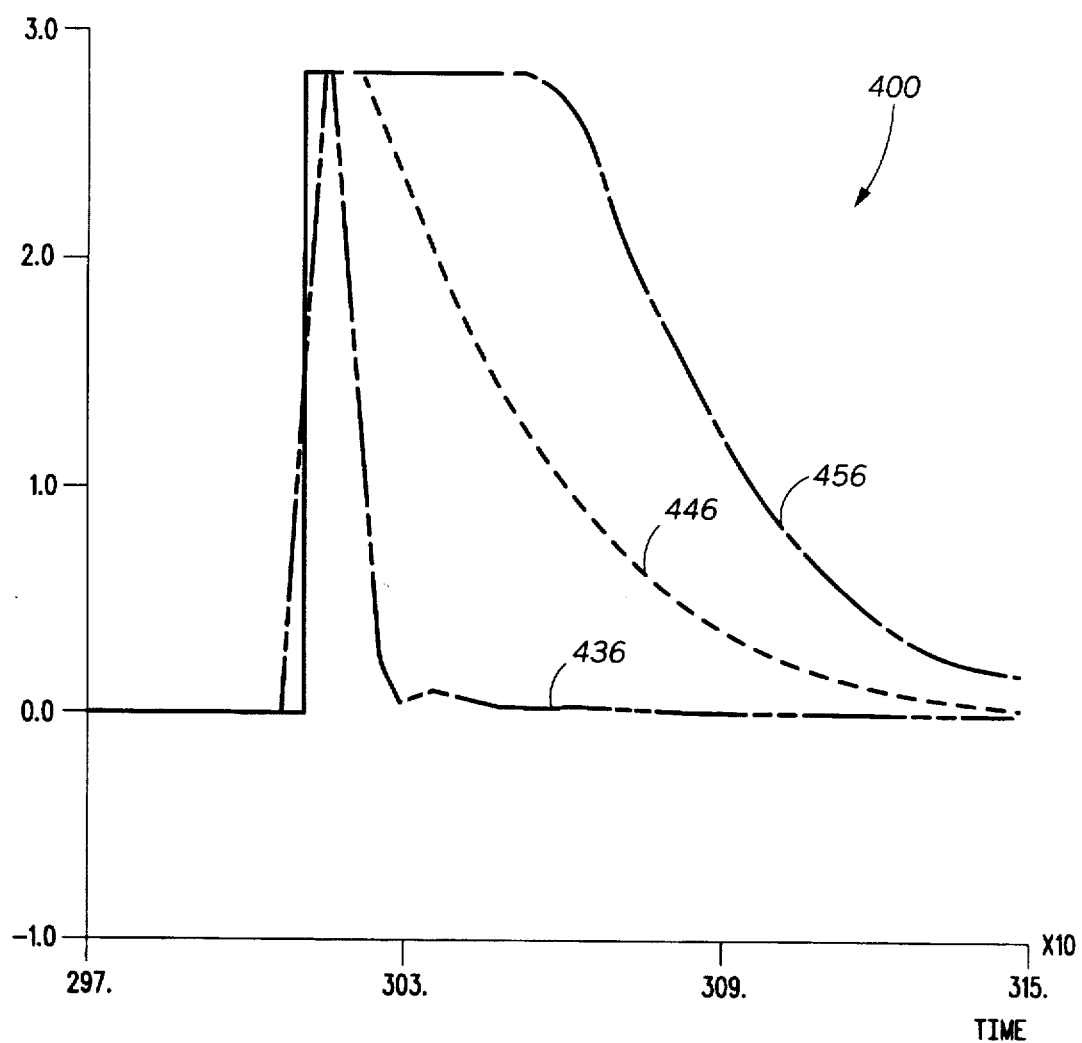
FIG. 4 is a graph showing the transient response of the discharge capacitors employed in the discharge circuit, according to one illustrative embodiment of the invention.

The discharge transistors 336, 346 and 356 could be chosen so as to have different sink currents, or they could have the same sink currents, depending on the characteristics of the load and the desired transient response. Similarly, the first predetermined delay could differ from the second predetermined delay, or they could be the same, depending on the desired transient response. By way of example, in the circuit shown, if the load is rated at 0.02 uF, the output stage voltage would be within 100 mV of that of the supply rails. If the second predetermined delay is longer than the first predetermined delay and if discharge transistor 336 comprises two parallel 100×1 devices, if discharge transistor 346 is a single 100×1 device and if discharge transistor 356 is a single 20×1 device, then the transient response 400 of the staging circuit elements would be as shown in FIG. 4. Transistor 336 would have a transient response corresponding to curve 436, transistor 346 would have a transient response corresponding to curve 446, and transistor 356 would have a transient response corresponding to curve 456. The bias current would be less than 500 uA, yet the circuit would have the ability to sink and source up to 40 mA in slewing current. This would render a bias efficiency of 40 mA/500 uA =80.

While the above-disclosed embodiments of the invention show circuitry employing integrated MOS technology, it will be readily understood that the invention could be embodied in one of many other circuit technologies. For example, the invention could be embodied using bipolar technology and could even be embodied with discrete circuit elements.

The embodiments described above are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. A ring inhibiting charging and discharging circuit for use with an amplification circuit that drives a load, the amplification circuit responsive to an input and capable of generating an output corresponding to the input, the input having an input voltage and the output having an output voltage, the ring inhibiting charging and discharging circuit comprising:

a charge element, responsive to the output from the amplification circuit, that is capable of charging the load when the input voltage is greater than a preselected multiple of the output voltage; and a discharge circuit, responsive to the output from the amplification circuit, including:

a feedback circuit that asserts a difference signal when the output voltage is less than the preselected multiple of the input voltage, and a staging circuit, responsive to difference signal, that gradually reduces a rate at which the load is discharged over a preselected period of time once the difference signal indicates that the output voltage is within a preselected range of the input voltage.

2. The ring inhibiting charging and discharging circuit of claim 1, wherein the feedback circuit comprises a difference amplifier having a first difference input that is electrically coupled to the input and a second difference input that is electrically coupled to the output, wherein the difference amplifier is configured to assert the difference signal when the first difference input has a voltage that is less than the second difference input.

3. The ring inhibiting charging and discharging circuit of claim 1, wherein the charge element comprises a transistor, having a first gate that is electrically coupled to the output of the amplification circuit, that electrically couples a voltage source to the load when the first gate has a voltage above a preselected value.

4. The ring inhibiting charging and discharging circuit of claim 1, wherein the staging circuit comprises:

a first discharge element, responsive to the difference signal, that sinks charge from the load when the difference signal is asserted and that substantially ceases to sink charge from the load when the difference signal is de-asserted;

at least one first delay element, responsive to the difference signal, that asserts a first delay signal with a minimal delay when the difference signal is asserted and that de-asserts the first delay signal after a first predetermined amount of time after the difference signal is de-asserted; and at least one second discharge element, responsive to the first delay signal, that sinks charge from the load when the first delay signal is asserted and that substantially ceases to sink charge from the load when the first delay signal is de-asserted.

5. The ring inhibiting charging and discharging circuit of claim 4, wherein the first discharge element comprises a transistor having a first channel node electrically coupled to the load, a second channel node electrically coupled to a ground and a second gate node, responsive to the difference signal, wherein charge flows from the first channel node to the second channel node when the difference signal is asserted.

6. The ring inhibiting charging and discharging circuit of claim 4, wherein the at least one first delay element comprises:

a first inverter that generates an inverted copy of the difference signal; and a second inverter that inverts the inverted copy of the difference signal, thereby generating the first delay signal.

7. The ring inhibiting charging and discharging circuit of claim 6, wherein the second inverter comprises:

a gate charging transistor that introduces a minimal delay; and a gate discharge transistor that introduces a delay greater than the minimal delay.

8. The ring inhibiting charging and discharging circuit of claim 6, wherein the first inverter and the second inverter each comprise a CMOS inverter.

9. The ring inhibiting charging and discharging circuit of claim 4, wherein the at least one second discharge element comprises a transistor having a third channel node electrically coupled to the load, a fourth channel node electrically coupled to a ground and a third gate node, responsive to the first delay signal, wherein charge flows from the third channel node to the fourth channel node when the first delay signal is asserted.

10. The ring inhibiting charging and discharging circuit of claim 4, further comprising:

a second delay element, responsive to the first delay signal, that asserts a second delay signal with a minimal delay when the first delay signal is asserted and that de-asserts the second delay signal after a second predetermined amount of time after the first delay signal is de-asserted; and a third discharge element, responsive to the second delay signal, that sinks charge from the load when the second delay signal is asserted and that substantially ceases to sink charge from the load when the second delay signal is de-asserted.

11. The ring inhibiting charging and discharging circuit of claim 10, wherein the second delay element comprises:

a third inverter that generates an inverted copy of the first delay signal; and a fourth inverter that inverts the inverted copy of the first delay signal, thereby generating the second delay signal.

12. The ring inhibiting charging and discharging circuit of claim 11, wherein the fourth inverter comprises:

a gate charging transistor that introduces a minimal delay; and a gate discharge transistor that introduces a delay greater than the minimal delay.

13. The ring inhibiting charging and discharging circuit of claim 11, wherein the third inverter and the fourth inverter each comprise a CMOS inverter.

14. The ring inhibiting charging and discharging circuit of claim 10, wherein the third discharge element comprises a transistor having a fifth channel node electrically coupled to the load, a sixth channel node electrically coupled to a ground and a fourth gate node, responsive to the second delay signal, wherein charge flows from a third channel node to a fourth channel node when the second delay signal is asserted.

15. An amplifier, having an input, the input having an input voltage and having an amplifier output, the amplifier comprising:

an amplification circuit that generates an output having an output voltage that is a preselected multiple of the input voltage;

a charge transistor, having a first gate that is electrically coupled to the amplification circuit, that electrically couples a voltage source to the amplifier output when the output voltage is less than the preselected multiple of the input voltage;

a difference amplifier configured to assert a difference signal when the output voltage falls below the preselected multiple of the input voltage;

a first discharge transistor having a first channel node electrically coupled to the amplifier output, a second channel node electrically coupled to a ground and a second gate node, responsive to the difference signal, wherein charge flows from the first channel node to the second channel node when the difference signal is asserted;

at least one first delay element, responsive to the difference signal, that asserts a first delay signal with a minimal delay when the difference signal is asserted and that de-asserts the first delay signal after a first predetermined amount of time after the difference signal is de-asserted;

a second discharge transistor having a third channel node electrically coupled to the amplifier output, a fourth channel node electrically coupled to a ground and a third gate node, responsive to the first delay signal, wherein charge flows from the third channel node to the fourth channel node when the first delay signal is asserted;

a second delay element, responsive to the first delay signal, that asserts a second delay signal with a minimal delay when the first delay signal is asserted and that de-asserts the second delay signal after a second predetermined amount of time after the first delay signal is de-asserted; and a third discharge transistor having a fifth channel node electrically coupled to the amplifier output, a sixth channel node electrically coupled to a ground and a fourth gate node, responsive to the second delay signal, wherein charge flows from the third channel node to the fourth channel node when the second delay signal is asserted.

16. The amplifier of claim 15, wherein the at least one first delay element comprises:

a first inverter that generates an inverted copy of the difference signal; and a second inverter that inverts the inverted copy of the difference signal, thereby generating the first delay signal.

17. The amplifier of claim 16, wherein the first inverter and the second inverter each comprise a CMOS inverter.

18. The amplifier of claim 15, wherein the second delay element comprises:

a third inverter that generates an inverted copy of the first delay signal; and a fourth inverter that inverts the inverted copy of the first delay signal, thereby generating the second delay signal.

19. The amplifier of claim 18, wherein the third inverter and the fourth inverter each comprise a CMOS inverter.

* * * * *